(12) United States Patent
Walecki et al.

(10) Patent No.: US 11,105,611 B2
(45) Date of Patent: Aug. 31, 2021

(54) NON-CONTACT MEASUREMENT OF A STRESS IN A FILM ON SUBSTRATE

(71) Applicant: APPLEJACK 199 L.P., Milpitas, CA (US)

(72) Inventors: Wojciech J Walecki, Sunrise, FL (US); Wei-Chun Hung, San Jose, CA (US); Raphael Morency, Santa Clara, CA (US)

(73) Assignee: APPLEJACK 199 L.P., Milpitas, CA (US)

( * ) Notice: Subject to any disclaimer, the term of this patent is extended or adjusted under 35 U.S.C. 154(b) by 527 days.

(21) Appl. No.: 15/980,375

(22) Filed: May 15, 2018

(65) Prior Publication Data
US 2019/0353475 A1 Nov. 21, 2019

(51) Int. Cl.
*G01B 11/16* (2006.01)
*G03F 9/00* (2006.01)
*G03F 7/20* (2006.01)

(52) U.S. Cl.
CPC .......... *G01B 11/16* (2013.01); *G03F 9/7046* (2013.01); *G03F 7/70883* (2013.01)

(58) Field of Classification Search
CPC .... G01B 11/16; G03F 9/7046; G03F 7/70883
USPC .......................................................... 703/7
See application file for complete search history.

(56) References Cited

U.S. PATENT DOCUMENTS

| | | | |
|---|---|---|---|
| 6,781,702 B2* | 8/2004 | Giannakopoulos .... | G01B 11/16 356/521 |
| 2005/0024612 A1* | 2/2005 | Hirukawa ........... | G03F 7/70883 355/55 |
| 2014/0352382 A1* | 12/2014 | Wang ....................... | B41K 3/62 72/54 |
| 2019/0377270 A1* | 12/2019 | Kanehara .............. | G03F 9/7046 |

OTHER PUBLICATIONS

Finot, M., et al. "Large deformation and geometric instability of substrates with thin-film deposits." Journal of applied physics 81.8 (1997). pp. 3457-3464. (Year: 1997).*

* cited by examiner

*Primary Examiner* — Kamini S Shah
*Assistant Examiner* — John E Johansen
(74) *Attorney, Agent, or Firm* — Maschoff Brennan

(57) ABSTRACT

A method and apparatus for non-contact measurement of stress in a thin-film deposited on a substrate is disclosed. The method may include positioning a substrate on a plurality of support-elements, the substrate having a thin-film deposited thereupon. A first-polynomial may be defined for representing a surface of the substrate that is in contact with the support elements. A second-polynomial may be determined based on an optimization determination of potential-energy acting upon the substrate. A finite-order polynomial may be created by calculating a product of the first and second polynomials to represent a shape of the surface of the substrate as a model of the surface. Thereafter, stress in the substrate may be determined based on fitting the model of the surface with a measured topographical data of the surface.

14 Claims, 16 Drawing Sheets

NON-CONTACT MEASUREMENT OF A STRESS IN A FILM ON SUBSTRATE

TECHNICAL FIELD

This disclosure generally relates to non-contact measurement of a stress in a film on a substrate.

BACKGROUND

Substrates having one or more layers of one or more thin-film material deposited thereupon may be used in many applications in the field of electronics. The thickness of such thin-film may range from about a few hundred angstroms to several micrometers.

Due to a variety of reasons including for example, differences in properties of the substrate material and that of the material used for the thin-film deposition, mechanical stress may develop in the thin-film. Mechanical stress developed in the thin-film can be either compressive or tensile. In a substrate having the thin-film deposited on top, development of compressive stress in the thin-film may cause the substrate to bow in a concave direction while development of tensile stress in the thin-film may cause the substrate to bow in a convex direction. Thus, in instances where a planar substrate is subjected to thin-film deposition, compressive as well as tensile stresses developed in the thin-film may cause a surface of the substrate to deviate from planarity. Mechanical-stress in thin-films is a potential cause of the substrate failure due to delamination and cracking of thin-films.

SUMMARY

This summary is provided to introduce a selection of concepts in a simplified format that are further described in the detailed description of the present disclosure. This summary is neither intended to identify key or essential inventive concepts of the disclosure, nor is it intended for determining the scope of the invention or disclosure.

In an embodiment, the present subject matter describes a method for non-contact measurement of stress in a thin-film deposited on a substrate. The method comprises positioning a substrate on a plurality of support-elements, the substrate having a thin-film deposited thereupon. A first-polynomial is defined for representing a surface of the substrate that is in contact with the support elements. In addition, a second-polynomial is determined based on an optimization determination of potential-energy acting upon the substrate. A finite-order polynomial is created by calculating a product of the first and second polynomials to represent a shape of the surface of the substrate as a model of the surface. Stress in the substrate is determined based on fitting the model of the surface with a measured topographical-data of the surface of the substrate.

In another embodiment, the present subject matter describes a method for non-contact measurement of stress in a thin-film deposited on a substrate. The method comprises representing a shape of a surface of the substrate by a model of the surface based on creating a finite-order polynomial. The finite order polynomial is defined by a product of a lower-order polynomial representing a surface of the substrate that is in contact with a plurality of support-elements, wherein the support elements support the substrate above ground. A higher-order polynomial is determined from an optimization determination of potential-energy acting upon the substrate. Thereafter, the model of the surface is fitted with a measured topographical-data by transforming the higher order polynomial into a fitted polynomial. The stress in the substrate is determined based on an updated finite-order polynomial defined by the product of the lower order polynomial and the fitted polynomial.

In another embodiment, the present subject matter describes an apparatus for non-contact based measurement of stress in a thin-film deposited on a substrate. The apparatus comprises a plurality of support elements supporting the substrate above ground, a topography measurement unit configured to measure topography data of the substrate. A processor is configured to cause performance of operations comprising a) defining a first-polynomial representing a surface of the substrate that is in contact with the support elements; b) determining a second-polynomial based on a potential-energy acting upon the substrate; c) creating a finite-order polynomial formed by calculating a product of the first and second polynomial to represent a shape of the surface of substrate as a model of the surface; and d) determining stress in the substrate based on fitting the model of the surface with the measured topographical data of the surface of substrate as received from the topography measurement unit.

To further clarify advantages and features of the invention claimed herein, example descriptions and embodiments are rendered by reference to specific embodiments thereof, which is illustrated in the appended drawings. It is appreciated that these drawings depict only example embodiments of the invention and are therefore not to be considered limiting of its scope. The disclosure will be described and explained with additional specificity and detail with the accompanying drawings.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Figure 1:
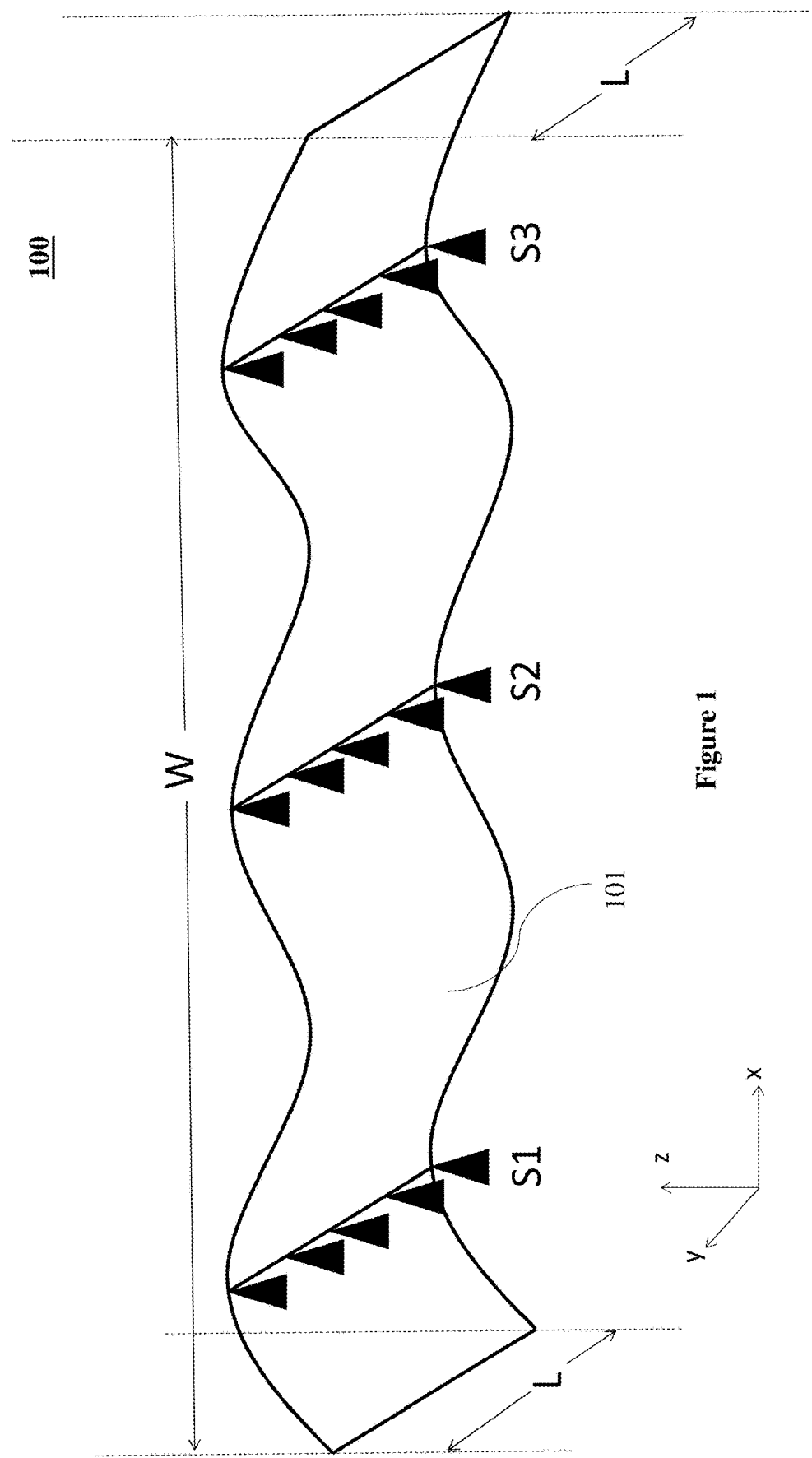
FIG. 1 illustrates an isometric view of set-up comprising a substrate supported on parallel rows defined by supporting elements, in accordance with an embodiment of the present disclosure.

The elements in the drawings are illustrated for simplicity and may not have been necessarily been drawn to scale. Furthermore, in terms of the construction of the device, one or more components of the device may have been represented in the drawings by conventional symbols, and the drawings may show only those specific details that are pertinent to understanding the embodiments of the present disclosure so as not to obscure the drawings with details that will be readily apparent to those of ordinary skill in the art having benefit of the description herein.

DETAILED DESCRIPTION OF SOME EXAMPLE EMBODIMENTS

For the purpose of promoting an understanding of the principles of the present disclosure, reference will now be made to the embodiment illustrated in the drawings and specific language will be used to describe the same. It will nevertheless be understood that no limitation of the scope of the present disclosure is thereby intended, such alterations and further modifications in the illustrated system, and such further applications of the principles of the present disclosure as illustrated therein being contemplated as would normally occur to one skilled in the art to which the present disclosure relates.

The foregoing general description and the following detailed description are explanatory of the present disclosure and are not intended to be restrictive thereof.

Reference throughout this specification to "an aspect", "another aspect" or similar language means that a particular feature, structure, or characteristic described in connection with the embodiment is included in at least one embodiment of the present disclosure. Thus, appearances of the phrase "in an embodiment", "in another embodiment" and similar language throughout this specification may, but do not necessarily, all refer to the same embodiment.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components.

Unless otherwise defined, all technical and scientific terms used herein have the same meaning as commonly understood by one of ordinary skill in the art to which this present disclosure belongs. The system, methods, and examples provided herein are illustrative only and not intended to be limiting.

Conventional mechanisms for stress-determination for substrates may require a substantial amount of time for their execution. One of the reason as may be attributed is 'piecewise analytical approach' followed in such mechanisms, which proves analytical in nature only with respect to certain portions of the substrate and not the entire substrate.

Another associated drawback with conventional-mechanisms is frequent occurrence of the substrate with respect to the support-points, which renders the calculations susceptible to errors and the consequent-results inaccurate. As discussed in detail below, the present disclosure relates to an improved mechanism for non-contact based stress determination of a substrate that may help overcome some of the deficiencies disclosed above or that may provide other improvements related to non-contact based stress determination of a substrate.

Embodiments of the present disclosure will be described below in detail with reference to the accompanying drawings.

FIG. 1 illustrates an isometric view of set-up 100 comprising a substrate 101 supported on parallel rows including support elements (S1, S2, S3) in accordance with an embodiment of the present subject matter. The substrate 101 may be defined by a width W (along x axis) and a length L along y axis and has a thin-film deposited at the surface.

In an example, the substrate 101 may be a bent-glass panel supported from below by the three parallel rows of the support elements S1, S2 and S3. Each of the rows S1, S2 and S3 may in turn include a series of linearly-placed support elements. The support elements within each row S1, S2, S3 may be equidistant from each other, and the rows S1, S2 and S3 may be dispersed symmetrically with respect to the substrate 101.

Figure 2:
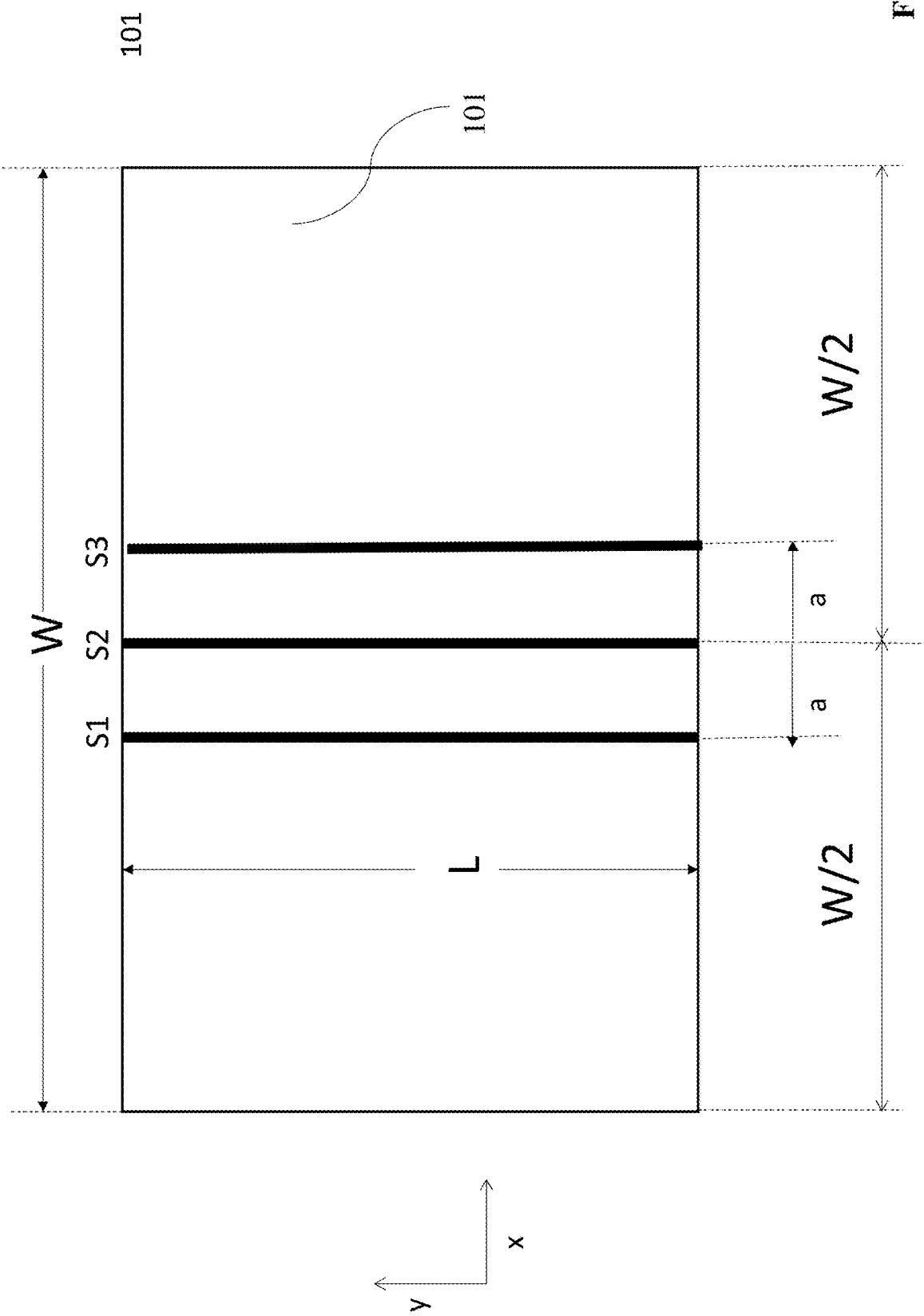
FIG. 2 illustrates a top-view of the set-up as depicted in FIG. 1, in accordance with an embodiment of the present disclosure.
Figure 3:
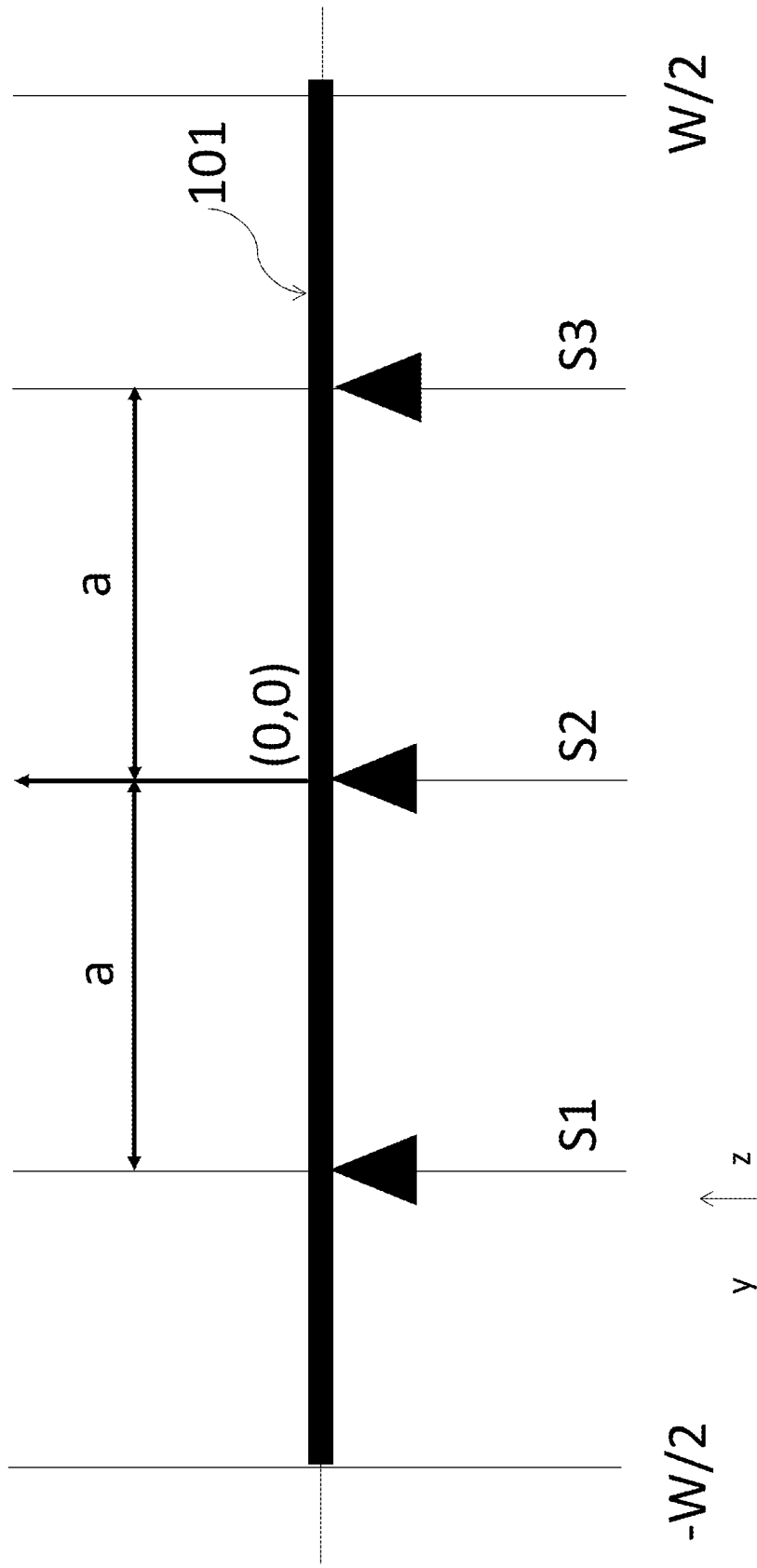
FIG. 3 illustrates a front-view of the set-up as depicted in FIG. 1, in accordance with an embodiment of the present disclosure.

FIG. 2 illustrates a top-view of the set-up 100 as depicted in FIG. 1, in accordance with an embodiment of the present subject matter. As indicated in the present figure, the three support elements S1, S2 and S3 are positioned symmetrically with respect to the substrate 101, such that S2 comprises the origin (i.e. x=0, y=0, z=0) in respect of a coordinate system comprising S1, S2 and S3. As shown in FIG. 3, the two support elements S1 and S3 are separated by a distance 2a, with S2 acting as the median. Accordingly, the distance 'a' is measured with respect to S2. Accordingly, the row S2 also corresponds to axis of symmetry with respect to the width of the substrate 101 and alternatively, a longitudinal axis of symmetry.

FIG. 3 illustrates a front-view of the set-up 100 as depicted in FIG. 1. As may be understood, S2 defines an origin of a coordinate system comprising S1, S2, S3 and a longitudinal axis of symmetry with respect to the width of the substrate 101.

Figure 4:
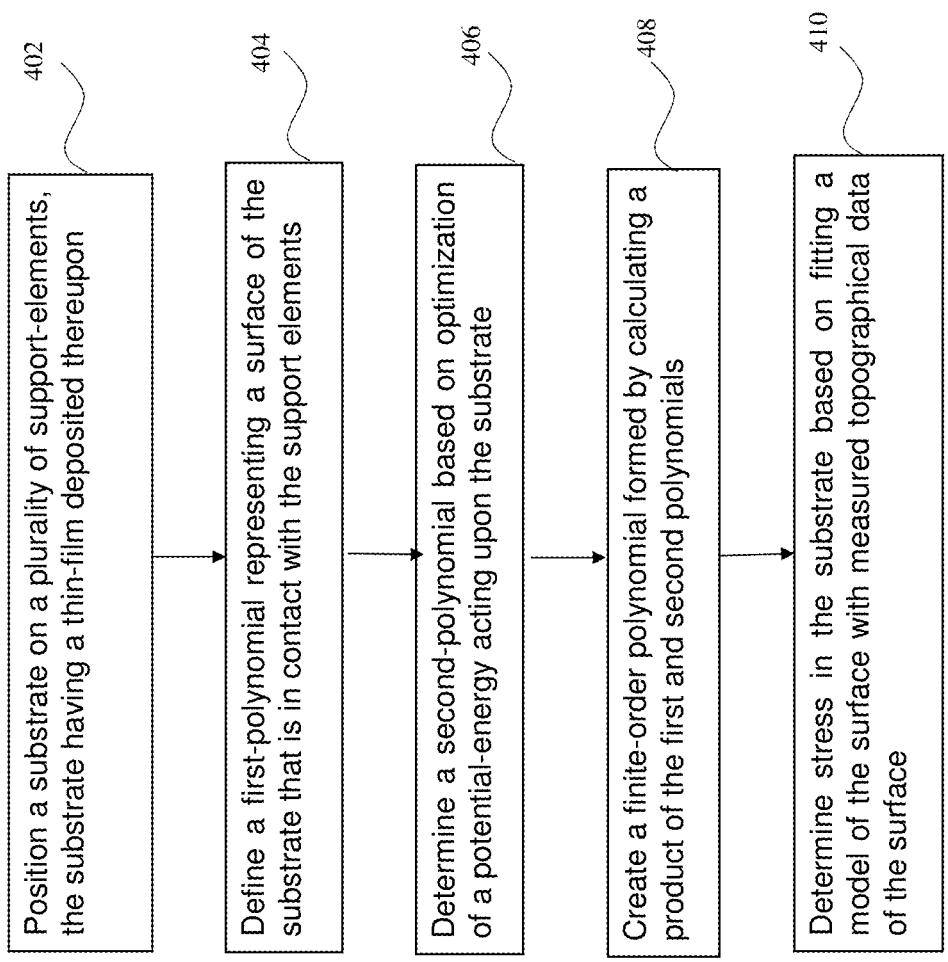
FIG. 4 illustrates a method of non-contact based measurement of stress in a thin-film deposited on a substrate, in accordance with an embodiment of the present disclosure.

FIG. 4 illustrates a method of non-contact measurement of stress in a thin-film deposited on a substrate, in accordance with one embodiment. The method comprises positioning (step 402) a substrate 101 on a plurality of support-elements, the substrate 101 having a thin-film deposited thereupon. The plurality of support elements may comprise a first support element and a second support element separated by a predefined distance, the first and second support elements positioned symmetrically with respect to the substrate. In other example, the plurality of support elements may comprise three symmetrically separated support-elements S1, S2, and S3.

In yet another example, the plurality of support elements S1, S2, S3 may be defined by at least three parallel-rows including a series of linearly placed support elements as have been shown in FIGS. 1 to 3, such that each of the parallel-rows are positioned symmetrically with respect to the substrate 101 and the S2 acts an axis of symmetry with respect to the width of the substrate 101. In other words, S2 acts as a longitudinal axis of symmetry with respect to the substrate 101.

Further, the method comprises defining (step 404) a first-polynomial representing a surface of the substrate that is in contact with the support elements S1-S3. In an example, the first polynomial may be defined by:

$$x(x-a)(x+a) \quad \text{(Equation 1)}$$

wherein 'a' is the spacing between any two of the equidistantly placed support elements S1, S2 and S3.

Thereafter, a second-polynomial $P_n(x)$ is determined (step 406) based on an optimization determination of potential-energy acting upon the substrate 101, as discussed below. Said second polynomial may be defined as:

$$P_n(x) = \Sigma_{k=0}^{n} c_k x^k \quad \text{(Equation 2)}$$

In an example, if $P_n(x)$ is a 12th order polynomial, i.e. if n=12, then $P_n(x)$ may be defined as follows:

$$P_n(x) = (c0 + c1*x + c2*x^2 \pm c3*x^3 + c4*x^4 + c5*x^5 + c6*x^6 + c7*x^7 + \ldots c8*x^8 + c9*x^9 + c10*x^{10} + c11*x^{11});$$

Accordingly, a finite-order polynomial or a function w (x, y) may be formed (step 408) by calculating a product of the first and second polynomials, i.e. Equation 1 and Equation 2 to represent a shape of the surface of the substrate as a mathematical model of the surface, such as represented by Equation 3 below.

$$w(x,y) = (x-a)x(x+a)P_n(x) \quad \text{(Equation 3)}$$

Further, the function or finite-order polynomial w(x,y) may undergo 'fitting' in order to fit topographical-data obtained with respect to the substrate 101, wherein said topographical-data may be obtained as later elaborated in FIG. 8. For such purposes, the second polynomial $P_n(x)$ may undergo the 'fitting process' to thereafter turn into a fitting polynomial. Accordingly, as a part of the determination of the second polynomial, one or more coefficients $c_k$ or 'starting-coefficients' are determined for the purposes of facilitating the fitting of the second polynomial.

In order to find the values of the $c_k$ coefficients of the polynomial $P_n$, free energy E may be determined and reduced or minimized with respect to the $c_k$ coefficients using a standard variational approach. For example, the free energy E may be represented as follows:

$$E = E_{elasticplate} + E_{gravity} + E_{film} \quad \text{(Equation 4)}$$

Sufficiently small curvatures κ of the substrate 101 may be approximated by $$\kappa = \frac{d^2 w(x)}{dx^2}$$

The potential energy stored in the bent substrate plate per unit area may be represented by:

$$E_{elasticplate} = \text{Plate}\left(\frac{d^2 w(x)}{dx^2}\right)^2 \quad \text{(Equation 5)}$$

where Plate=$EY*h^3/(24(1-v^2))$,
where EY is Young's modulus,
h is substrate plate thickness, and v is the Poisson's ratio.
The gravitational potential energy may be represented by:

$$E_{gravity} = \text{Grav } w(x) \quad \text{(Equation 6)}$$

where Grav=gph
g is free fall acceleration having usual value 9.8 m/s$^2$,
ρ is substrate plate density, and
h is the substrate plate thickness, As may be apparent to those skilled in the art, the calculations in the present subject matter may ignore the density ρh of the thin-film as a matter of approximation. In another example, said density ρh may be included by substituting ph with surface density of the thin-film coated substrate 101.

Further, an elastic energy density stored in a bent film of the substrate 101 may be represented by:

$$E_{film} = \text{Film} \frac{d^2 w(x)}{dx^2}, \text{ where Film} = -\left(\frac{h}{2}\right)\sigma t \quad \text{(Equation 7)}$$

where tensile intrinsic stress in the thin-film σ has positive and t is thickness of thin-film.

In the aforesaid equation 7, it may be assumed that that the stress value σ does not change as a result of bending. Now, regard may be had to the Equation 4, wherein the Total free energy density have been represented as:

$$E = E_{elasticplate} + E_{gravity} + E_{film} \quad \text{(Equation 4)}$$

Therefore, the total energy in the substrate 101 per unit length in direction of y-axis may be represented as:

$$E_{TOT} = \int_{-W/2}^{W/2} E \, dx \quad \text{(Equation 8)}$$

By substituting Equation 4, and later Equations 5, 6, 7 into Equation 8, $E_{TOT}$ may be expressed as a function of w(x), and $$\frac{d^2 w(x)}{dx^2}.$$

$$E_{TOT} = \int_{-W/2}^{W/2} E\left(w, \frac{d^2 w(x)}{dx^2}\right) dx \quad \text{(Equation 9)}$$

Thereafter, based on Equation 9, formulas or mathematical expressions pertaining to of coefficients c1 to $c_k$ may be found by solving the system of equations as follows:

$$\begin{cases} \dfrac{\partial E_{TOT}}{\partial c_0} = 0 \\ \dfrac{\partial E_{TOT}}{\partial c_1} = 0 \\ \quad \ldots \\ \quad \ldots \\ \dfrac{\partial E_{TOT}}{\partial c_n} = 0 \end{cases}$$ (Equation 10)

In an example, said formulas may be computed through standard MATLAB® functions such as symw. Thereafter, upon having determined the starting coefficients $c_1$ to $c_k$, the model of the surface represented by the finite order polynomial w(x) in Equation 3 may undergo a fitting process to fit with the topographical data of surface as measured through various known topographic measurement techniques for the substrate. For such purposes, the model of the surface or the function w(x) may be modified while fitting with the topographical data at least through fitting $P_n(x)$ with various parameters/values and turning the same into a fitted polynomial. Based on the modified w(x) or the fitted-polynomial $P_n(x)$, an intrinsic stress within the film of the substrate 101 may be calculated (step 410) based on the resulting 'updated' values of the coefficients of $P_n(x)$.

More specifically, the updated coefficients of $P_n(x)$ may be used to further calculate an updated value of elastic-energy density stored in the bent film of the substrate 101. Thereafter, an intrinsic stress in the film is calculated based on Equation 7. Overall, once the fitted polynomial $P_n(x)$ is fit with a measured topographical data of the substrate 101, a modified model of the surface of the substrate 101 is obtained, and stress may be determined at least based on coefficients of fitted polynomial $P_n(x)$.

In one example, the substrate 101 may be a glass-panel. Further, the topography data of the substrate may be captured through commonly known techniques based upon the interferometers, laser scanners, and techniques includes but not limited to, triangulation-probes.

Figure 5:
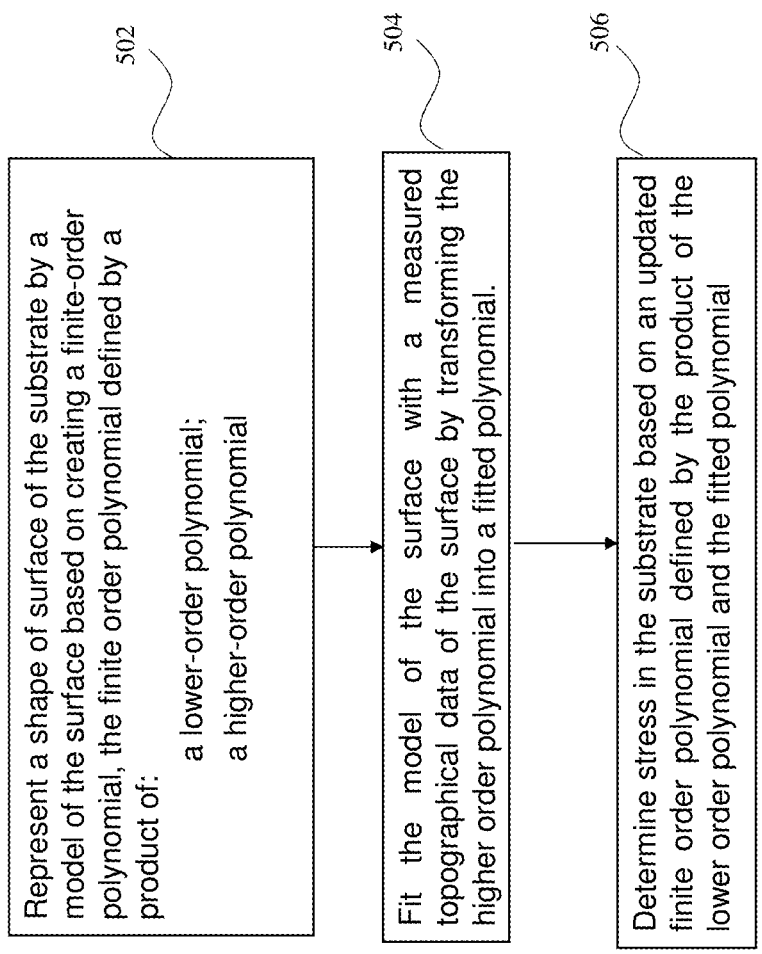
FIG. 5 illustrates a method of non-contact based measurement of stress in a thin-film deposited on a substrate, in accordance with another embodiment of the present disclosure.

FIG. 5 illustrates a method of non-contact based measurement of stress in a thin-film deposited on a substrate, in accordance with another embodiment of the present disclosure. The method comprises representing (502) a shape of the surface of the substrate by a model of the surface based on creating a finite-order polynomial w (x, y) as depicted with respect to Equation 3. The finite-order polynomial may be defined by a product of a lower-order polynomial representing a surface of the substrate that is in contact with a plurality of support-elements, in accordance with Equation 1. A higher-order polynomial $P_n(x)$ is determined from an optimization determination of potential-energy acting upon the substrate, in accordance with the Equations 2 till 10. The present method step 502 may be analogous to the steps 404, 406 and 408. In the present disclosure, reference to an "optimization determination of potential energy" or "determining an optimization of potential energy" may refer to calculations that may be performed with respect to the potential energy in a manner that may reduce or minimize free energy such as described above with respect to Equations 2-10. It is understood that the term "optimization" does not require the absolute most optimized determination in every instance.

Further, the method comprises fitting (step 504) the model of the surface with a measured topographical data of the surface by transforming the higher order polynomial into a fitted polynomial as explained at least with respect to the step 410 of FIG. 4.

Further, the method comprises determining (step 506) stress in the substrate 101 based on an updated finite-order polynomial defined by the product of the lower order polynomial and the fitted polynomial. The stress may be calculated based on updated value of the finite order polynomial w(x, y) or the fitted polynomial $P_n(x)$ present therein.

Modifications, additions, or omissions may be made to the method in FIG. 4 and FIG. 5 without departing from the scope of the present disclosure. For example, the operations of the methods may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the disclosed embodiments.

Figure 6:
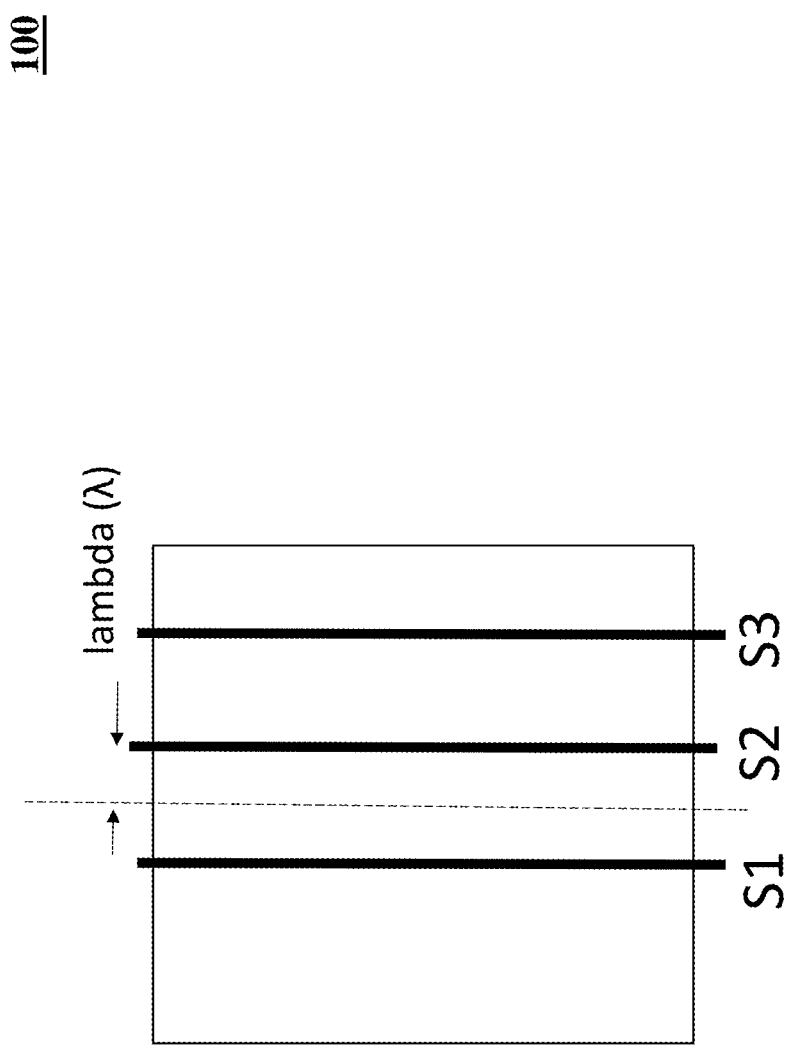
FIG. 6 illustrates the top-view as depicted in FIG. 2, wherein the substrate is linearly mis-aligned with respect to the support elements.

FIG. 6 illustrates the top-view as depicted in FIG. 2, wherein the substrate is linearly mis-aligned by a distance (e.g., λ) with respect to the support elements. Such misalignment may be due to asymmetric placement of support elements S1, S2 and S3 with respect to the substrate 101 or vice-versa. More specifically, while S1, S2 and S3 may be equidistant and parallel with respect to each other, S2 may be linearly-offset from the longitudinal-axis of symmetry (as represented by dotted line) of the substrate by a distance (λ) in a direction perpendicular to an axis of the support elements coplanar with the support elements S1, S2, S3. Accordingly, in the present scenario, the shape of the substrate 101 may be represented by correction of the second polynomial based on the linear-misalignment to thereby result in the following polynomial equation:

$w(x,y,\lambda)=(x-a)x(x+a)P_n(x,\lambda)$ where $P_n(x,\lambda)=\Sigma_{k=0}^n c'_k(\lambda)x^k$ (Equation 11)

Thereafter, the total energy in the substrate panel per unit length i.e. $E_{TOT}$ may be accordingly modified or corrected as follows:

$$E_{TOT}(\lambda) = \int_{-\frac{W}{2}+\lambda}^{\frac{W}{2}+\lambda} E\left(w, \frac{d^2 w}{dx^2}\right) dx$$ (Equation 12)

Thereafter, based on Equation 12, formulas or mathematical expressions pertaining to the coefficients c1 to $c_k$ may be found by solving the following system of equations $$\begin{cases} \dfrac{\partial E_{TOT}(\lambda)}{\partial c_0} = 0 \\ \dfrac{\partial E_{TOT}(\lambda)}{\partial c_1} = 0 \\ \quad \ldots \\ \quad \ldots \\ \dfrac{\partial E_{TOT}(\lambda)}{\partial c_n} = 0 \end{cases}$$ (Equation 13)

Figure 7:
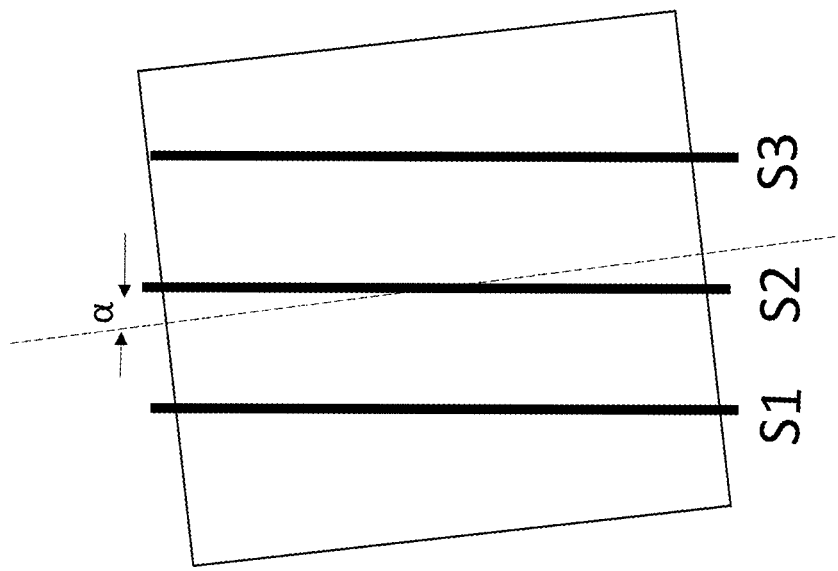
FIG. 7 illustrates the top-view as depicted in FIG. 2, wherein the substrate is angularly mis-aligned with respect to the support elements.

FIG. 7 illustrates the top-view as depicted in FIG. 2, wherein the substrate 101 is angularly mis-aligned with respect to the support-elements. Such misalignment may be due to asymmetric placement of the support elements S1, S2 and S3 with respect to the substrate 101 or vice versa. More specifically, while S1, S2 and S3 may be equidistant and parallel with respect to each other, S2 may be angularly-offset from the longitudinal axis of symmetry of the substrate 101 by an angle (a). In other words, the substrate 101 may be angularly-displaced with respect to the axis of rotation normal to the plane span by the support elements S1, S2, S3.

In the present scenario, the shape of the substrate may be represented through correction of the second polynomial based on the angular-misalignment to thereby result in the following polynomial equation:

$$(x,y,\lambda,\alpha)=(x-a)x(x+a)P_n(x) \text{ where } P_n(x,\lambda(y))=\Sigma_{k=0}^n c'_k (\lambda(y))x^k \quad \text{(Equation 14)}$$

The misalignment due to such angular-offset may be represented by an 'effective lambda' or $\lambda$ (y) as follows:

$$\lambda(y) = \lambda_0 + \alpha \frac{y}{L/2} \quad \text{(Equation 15)}$$

wherein, $\lambda_0$ represents the offset along x axis; and $$\alpha \frac{y}{L/2}$$

represents the offset along y axis

Based upon value of said effective lambda, the total energy in the substrate per unit length i.e. $E_{TOT}$ may be accordingly modified and the coefficients may be calculated accordingly in line with Equations 12 and Equations 13.

Figure 8:
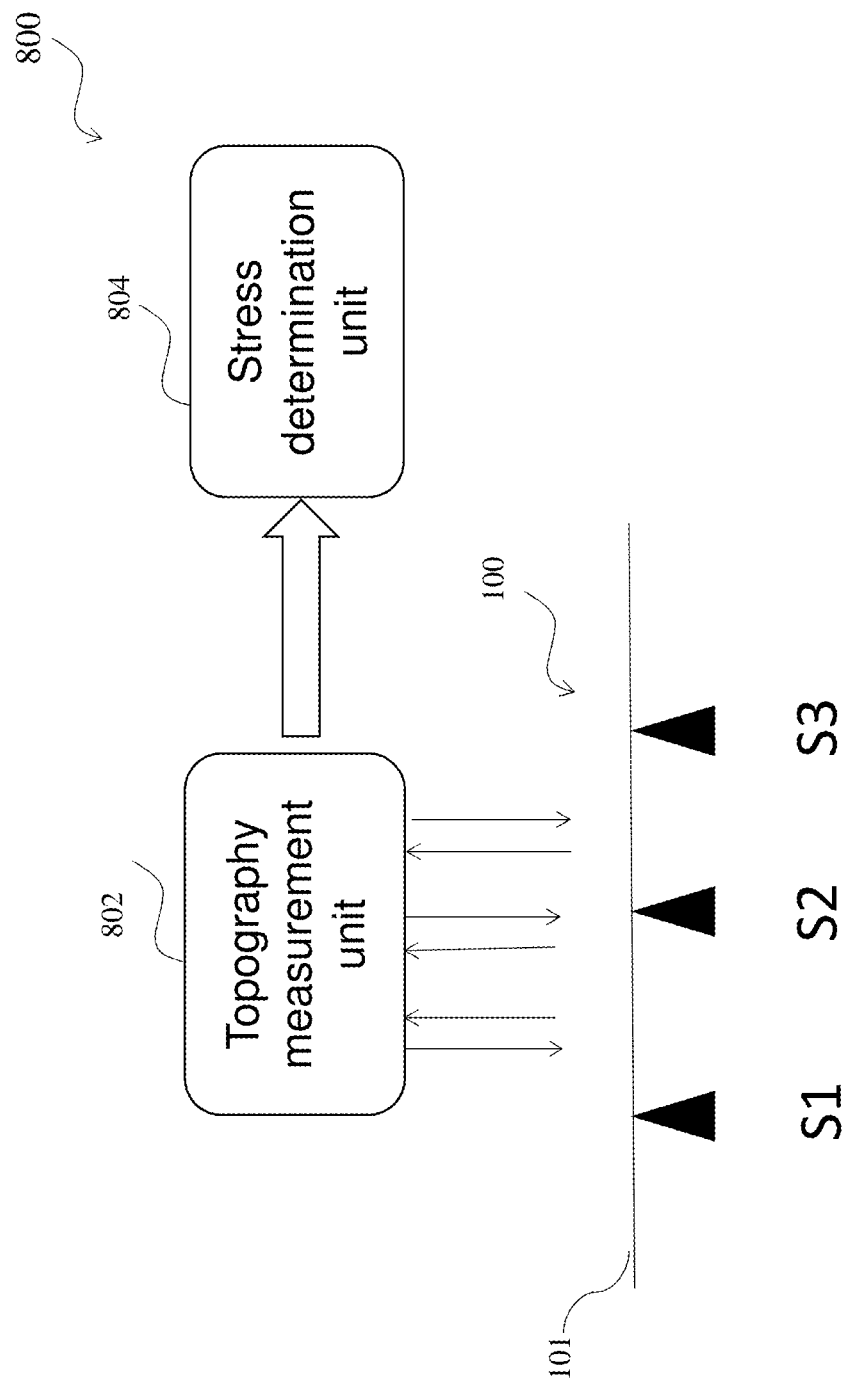
FIG. 8 illustrates an arrangement for non-contact based measurement of stress in a thin-film deposited on a substrate based on the set-up as described in FIG. 1, in accordance with an embodiment of the present disclosure.

FIG. 8 illustrates an arrangement 800 for non-contact based measurement of stress in a thin-film deposited on a substrate based on the set-up 100 as described in FIG. 1, in accordance with an embodiment of the present disclosure. The arrangement 800 includes a topography measurement unit 802 for gathering topographical data of the surface with respect to the substrate 101 and a stress determination unit 804 for determining the stress based on fitting a model of the surface of the substrate (i.e. finite order polynomial based) with the topographical data as gathered from the topography measurement unit 802.

The topography-measurement unit 802 may be used to measure the topography data of the surface of the substrate, based on a triangulation probe technique. A similar technique to measure a shape of the glass panel has been described in Finot Et. Al in *J. Appl. Phys, volume* 81, *page* 3457 (1997). Specifically, the unit 802 may include a set of cameras, an array of LED positioned on, or behind LED panels. The LED panels may be configured to emit a beam of light towards a surface of the substrate 101. The cameras may be configured to capture a reflected beam of light that includes at least a portion of the emitted beam as reflected from a surface of the substrate 101. Further, the unit 802 may include a detector unit (e.g. a charge coupled device based array detector) configured to detect topography data of the substrate 101 by observing change in optical path of the reflected rays.

The stress determination unit 804 on the other hand may be implemented through a computing-system by configuring a processor for executing the instructions corresponding to the method steps as defined by the method steps 404 till 410, and 502 till 506.

Numerical Results

Figure 9:
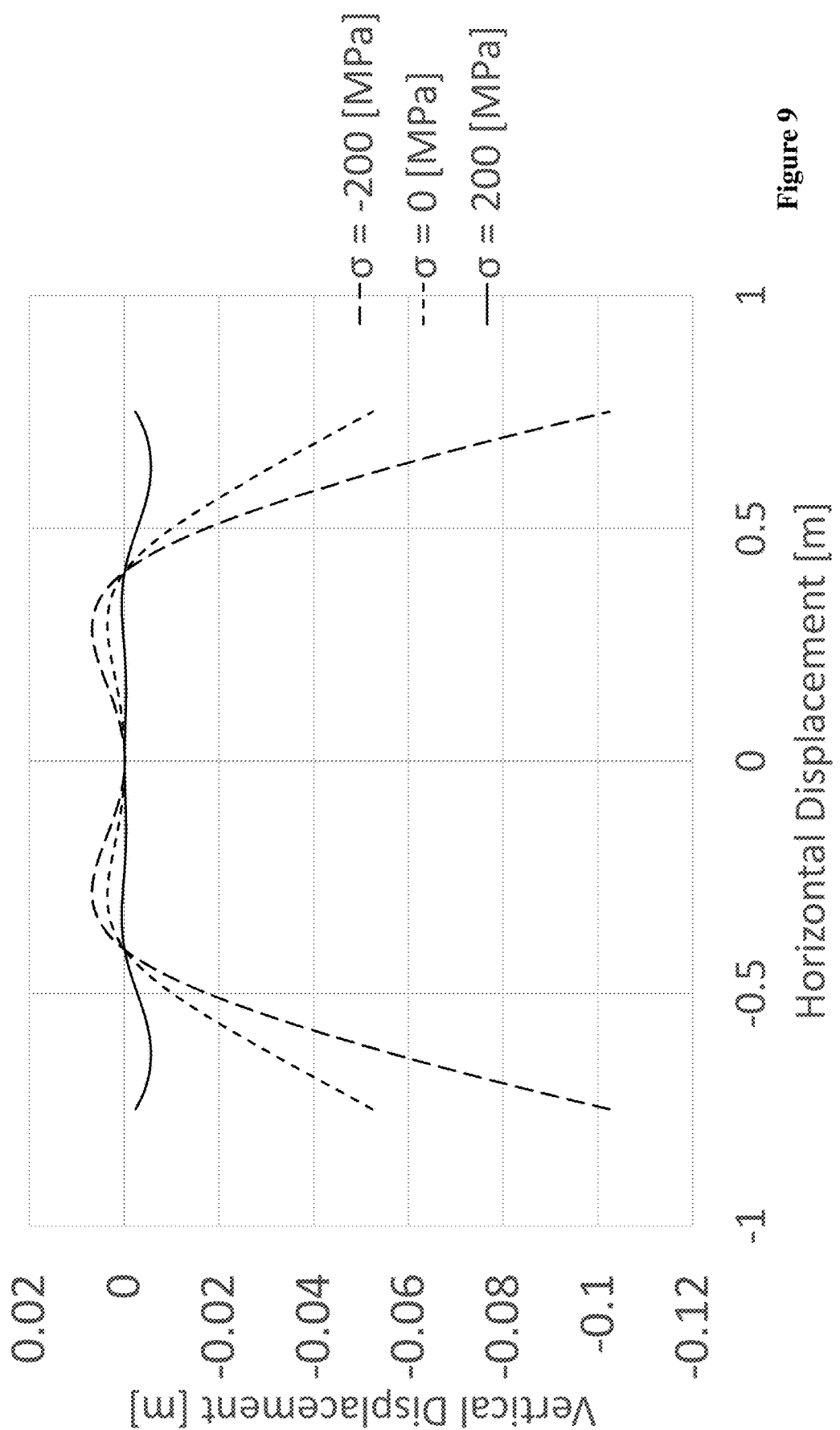
FIG. 9 illustrates a graph representing different vertical-displacements within the substrate, which is supported on three supporting elements, against various values of intrinsic-stress in a thin-film deposited on the substrate.

FIG. 9 illustrates a graph representing different types of vertical displacements within the substrate against various values of intrinsic-stress in a thin-film deposited on the substrate 101. Assuming that the substrate 101 is positioned over three support elements (S1, S2, S3) or pins on a support arrangement as illustrated in FIG. 1, the x-axis of the graph as illustrated in FIG. 9 represents the width W or horizontal positions within the shape of the substrate 101. On the other hand, the y-axis of the graph represents the vertical displacements within the shape of substrate 101 due to the stress.

More specifically, the present FIG. 9 depicts the shape of substrate 101 against three distinct-values of intrinsic-stress, e.g. $\sigma$=−200 MPa (dashed line), 0 MPa (solid line), +200 MPa (chain line), in a thin-film deposited on the substrate 101. The fixed numerical values of parameters used in calculation of said different shapes of substrates are Width W=1.5 m; Length L=1.85 m; Young Modulus=68.5 GPa; Poisson ratio $\nu$=0.22; substrate plate density $\rho$=2.42E03 kg/m$^3$; g=9.8 m/s$^2$; $T_{substrate}$=5.0E-4 m; $T_{film}$=8.0E-6 m; and inter support element distance 'a'=0.4064 m.

Figure 10:
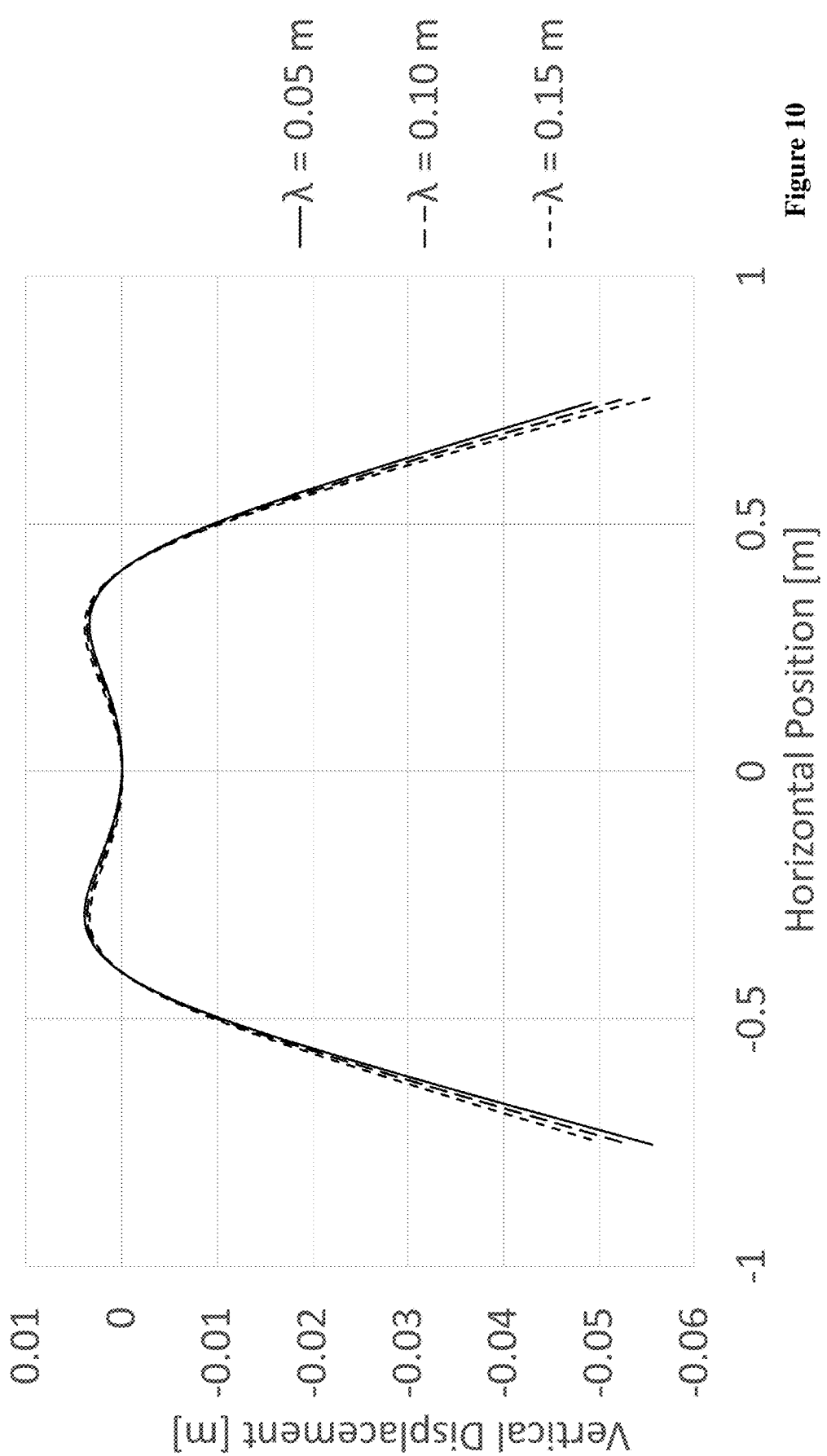
FIG. 10 illustrates a graph representing variation of vertical-displacements in the substrate against various misaligned positions of the substrate with respect to the three supporting elements.

FIG. 10 illustrates a graph representing different types of vertical displacements within the shape of substrate 101 against various values of $\lambda$ (e.g. linear or angular misalignment) as discussed in FIG. 6 and FIG. 7. Assuming that the substrate 101 is positioned on a support arrangement as illustrated in FIG. 1, the x-axis of the graph represents the width or horizontal-positions of the shape of the substrate. On the other hand, the y axis of the graph depicts the vertical-displacements within the substrate 101 due to stress.

More specifically, the present figure depicts the shape of substrate against three distinct values of $\lambda$ (0.05, 0.1, 0.15) in a thin-film deposited on the substrate. The fixed numerical values of parameters used in calculation of said different shapes of substrates are Width W=1.5 m; Length L=1.85 m; Young Modulus=68.5 GPa; Poisson ratio $\nu$=0.22; substrate plate density $\rho$=2.42E03 kg/m$^3$; g=9.8 m/s$^2$; $T_{substrate}$=5.0E-4 m; $T_{film}$=8.0E-6 m; intrinsic stress $\sigma$=100 Mpa and support element distance 'a'=0.4064 m.

Figure 11:
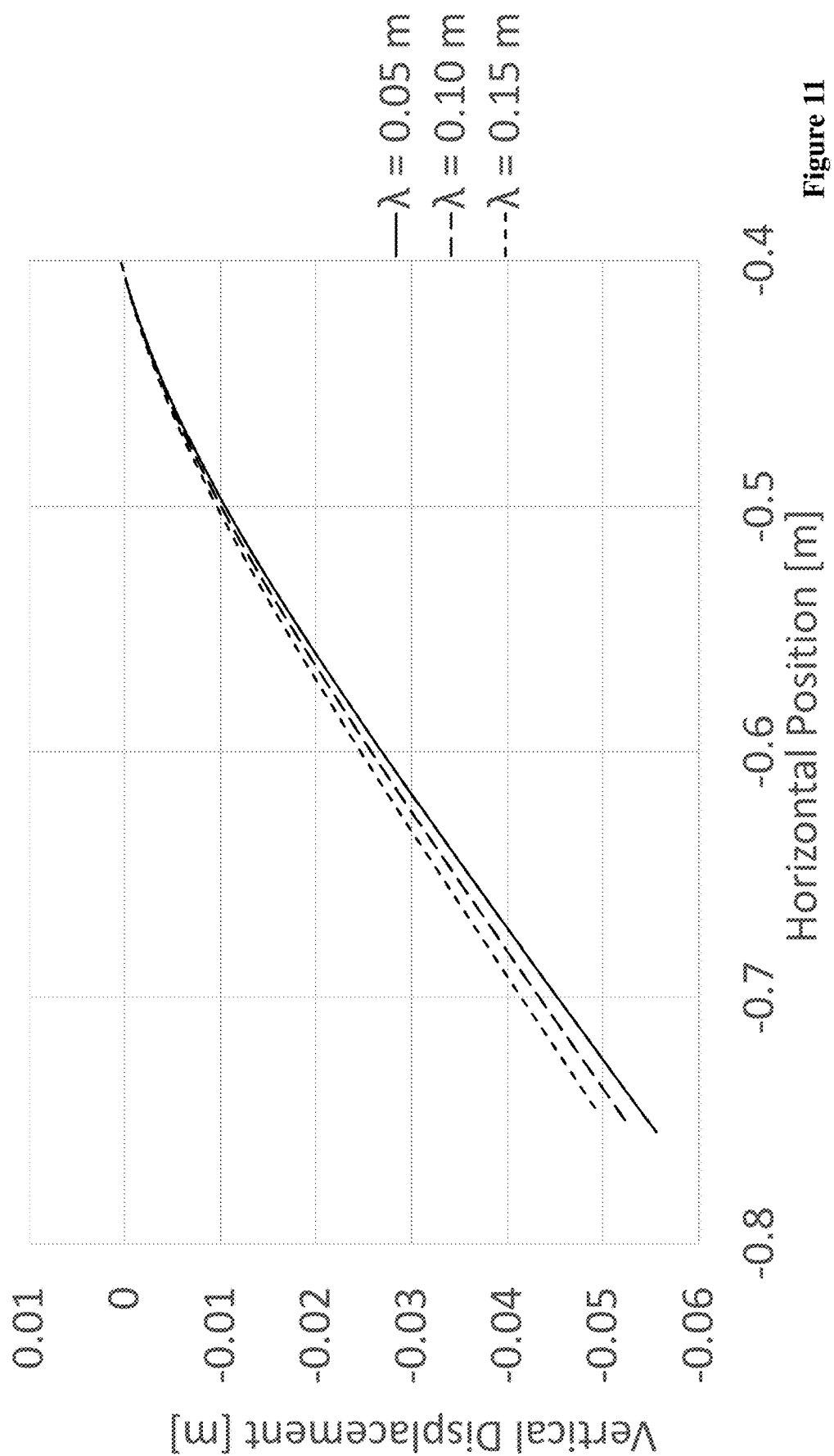
FIG. 11 illustrates a graph representing the variation at the left-side portion of the graph as depicted in FIG. 10.

FIG. 11 illustrates a graph representing the variation at the left-side portion of the graph as depicted in FIG. 10. As may be observed, the x-axis of the graph of FIG. 11 represents left side width of the substrate 101, and more specifically, the portion of the substrate at the 'left' of support element S1.

Figure 12:
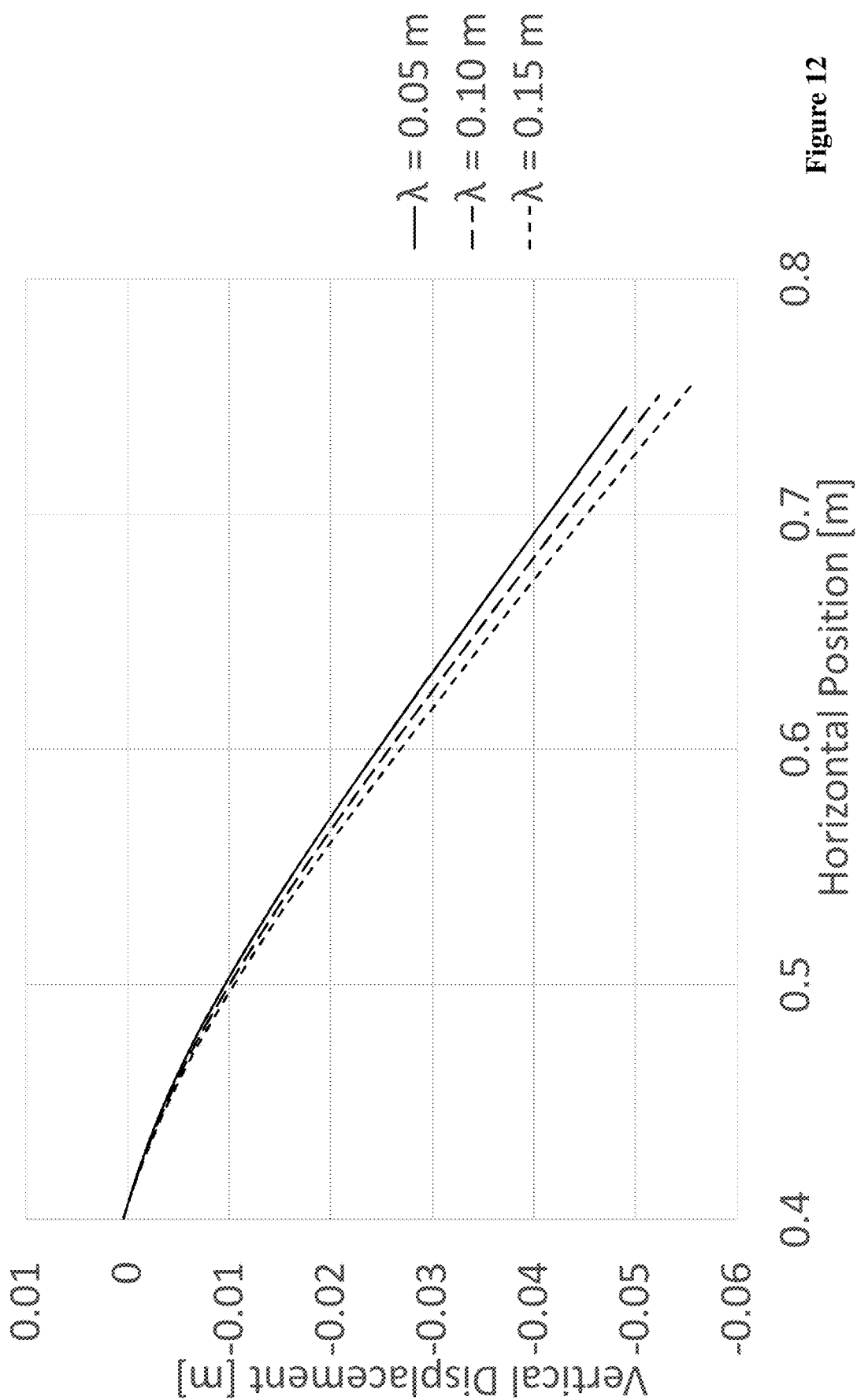
FIG. 12 illustrates a graph representing the variation at the right hand-side portion of the graph as depicted in FIG. 10.

FIG. 12 illustrates a graph representing the variation at the left-side portion of the graph as depicted in FIG. 10. As may be observed, the x-axis of the graph of FIG. 11 represents left side width of the substrate, and more specifically, the portion of the substrate at the right of the support element S3.

Figure 13:
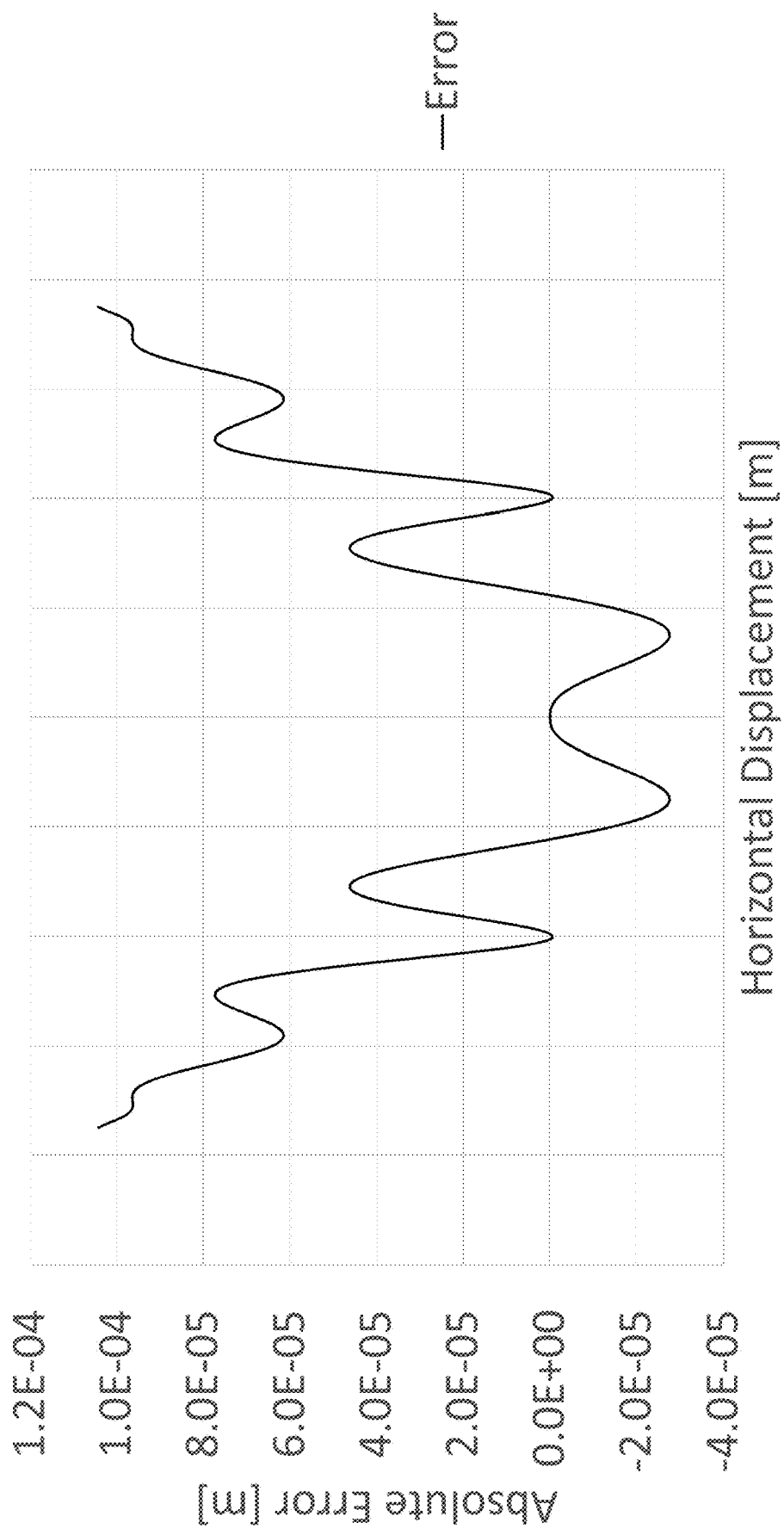
FIG. 13 illustrates a graph representing difference between an exact piece wise analytical model for stress-determination and present subject matter's analytical model.

FIG. 13 illustrates a graph representing difference between an exact piece-wise analytical model for stress-determination and present subject matter's analytical model. More specifically, FIG. 13 represents the error in the shape of substrate determined through the exact piece wise analytical model described in Kuroki et al.[1], when compared with present subject matter's analytical model based on usage of $P_n(x)$ as $12^{th}$ order polynomial (e.g. n=12 in Equation 2).

[1] Kuroki, H., Kobyakov, A., & Meda, G. (2004). 56.1: Analytical Approach to Evaluate Maximum Gravitational Sag and its Variations of Glass Substrate for LCD. SID Symposium Digest of Technical Papers, 35(1), 1488. https://doi.org/10.1889/1.1821364

Figure 14:
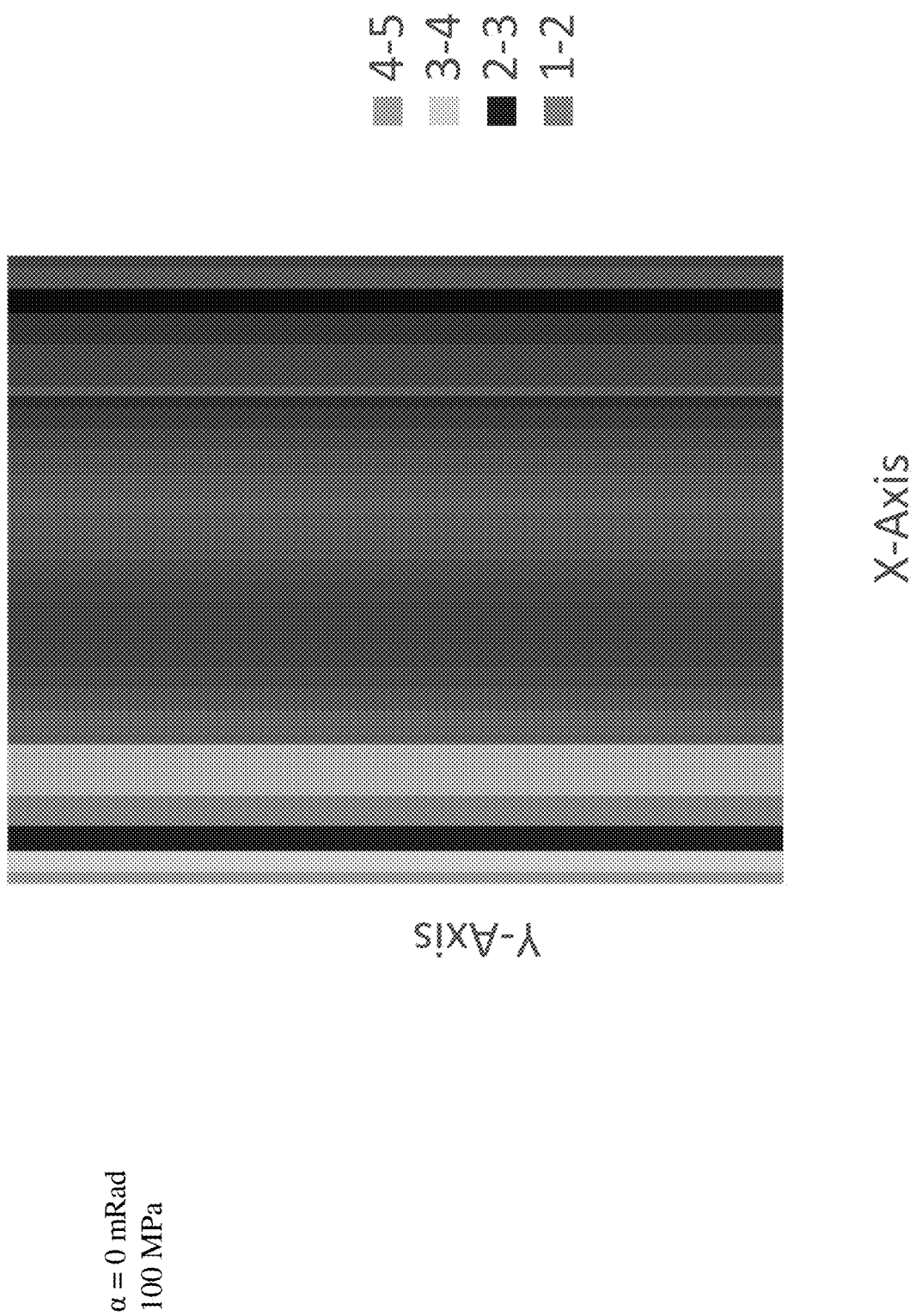
FIG. 14 illustrates a contour-map with respect to a pre-defined angular misalignment of the substrate with respect to the support elements.

FIG. 14 illustrates a contour-map with respect to a pre-defined angular misalignment of the substrate with respect to the support elements. More specifically, FIG. 14 represents the contour map of calculations for a (as referred in FIG. 7) to be 'zero'. The numerical-values of parameters used in the calculations are the following Width W=1.5 m; Length L=1.85 m; Young Modulus=68.5 GPa; µ=0.22; density ρ=2.42E03 kg/m$^3$; g=9.8 m/s$^2$; $T_{substrate}$=4.0E-4 m; $T_{film}$=1.0E-3 m; σ=100 MPa; a=0.419 m.

Figure 15:
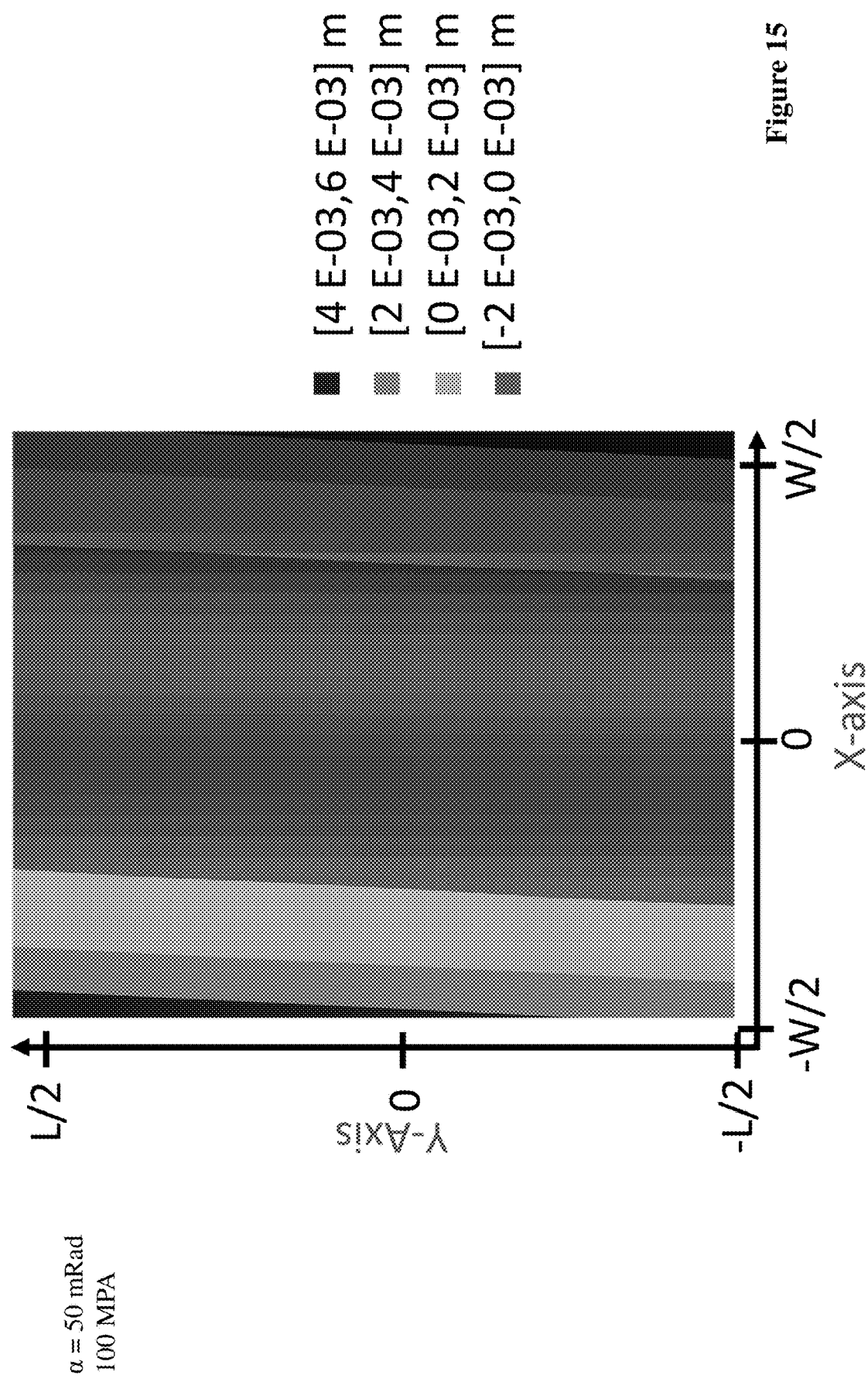
FIG. 15 illustrates a contour-map with respect to another pre-defined angular misalignment of the substrate with respect to the support elements.

FIG. 15 illustrates a contour-map with respect to another pre-defined angular misalignment of the substrate with respect to the support elements. More specifically, FIG. 14 represents the contour map of calculations for α equal to '50 Radians'. The other numerical-values of parameters (W, L, lambda, plate, gravity, a) used in the calculations are equivalent to FIG. 14.

In an example, the contour map with respect to FIG. 14 and FIG. 15 is generated through standard MATLAB® functions. For example, MATLAB® function "ContourPlotDataMaker2d" may be employed to calculate numerical values of coefficients of the polynomial by substituting values of W, L, lambda, plate, gravity, 'a' into the already calculated mathematical expression or formulas with respect to the coefficients (as explained with respect to FIG. 4). Based on the function "ContourPlotDataMaker2d", the shape of the substrate is calculated in a 30×37 matrix as a thousand points. Thereafter, the contour plot is generated using standard MATLAB® function "contourf".

Figure 16:
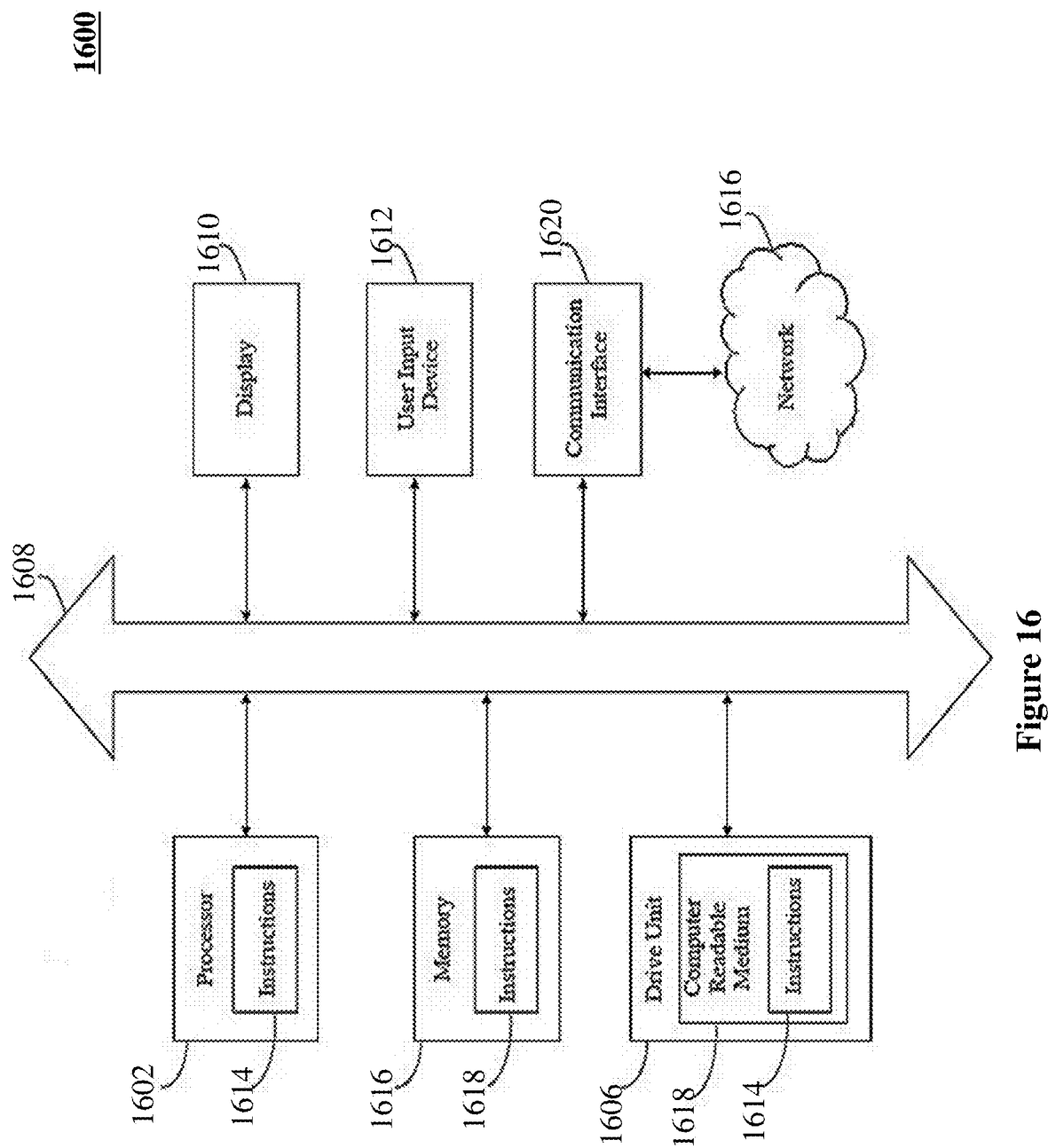
FIG. 16 illustrates a computing-device based implementation of the system as depicted in FIG. 6.

FIG. 16 shows yet another example implementation in accordance with the embodiment of the present disclosure by depicting a computing-system configured to act as the stress determination unit 804 for calculating the stress of the substrate 101 deposited with the thin film. More specifically, the present figure illustrates an example hardware configuration of the stress determination system 804 as a computing system 1600. The computing system 1600 can include a set of instructions that can be executed to cause the computing system 1600 to perform any one or more of the methods disclosed. The computing system 1600 may operate as a standalone device or may be connected, e.g., using a network, to other computing systems or peripheral devices.

In a networked deployment, the computing system 1600 may operate in the capacity of a server or as a client user computer in a server-client user network environment, or as a peer computer system in a peer-to-peer (or distributed) network environment. The computing system 1600 can also be implemented as or incorporated across various devices, such as a personal computer (PC), a tablet PC, a personal digital assistant (PDA), a mobile device, a palmtop computer, a laptop computer, a desktop computer, or any other machine capable of executing a set of instructions (sequential or otherwise) that specify actions to be taken by that machine. In an example implementation, the computing system 1600 may be a mobile computing cam display device capable of being used by a user. Further, while a single computing system 1600 is illustrated, the term "system" shall also be taken to include any collection of systems or sub-systems that individually or jointly execute a set, or multiple-sets, of instructions to perform one or more computing functions.

The computing system 1600 may include a processor 1602 e.g., a central processing unit (CPU), a graphics processing unit (GPU), or both. The processor 1602 may be a component in a variety of systems. For example, the processor 1602 may be part of a standard personal computer or a workstation. The processor 1602 may be one or more general processors, digital signal processors, application specific integrated circuits, field programmable gate arrays, servers, networks, digital circuits, analog circuits, combinations thereof, or other now known or later developed devices for analyzing and processing data. The processor 1602 may implement a software program, such as code generated manually (e.g. programmed).

The computing system 1600 may include a memory 1604, such as a memory 1604 that can communicate via a bus 1608. The memory 1604 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one example, the memory 1604 includes a cache or random access memory for the processor 1602. In alternative examples, the memory 1604 is separate from the processor 1602, such as a cache memory of a processor, the system memory, or other memory. The memory 1604 may be an external storage device or database for storing data. The memory 1604 is operable to store instructions executable by the processor 1602. The functions, acts or tasks illustrated in the figures or described may be performed by the programmed processor 1602 executing the instructions stored in the memory 1604. The functions, acts or tasks are independent of the particular type of instructions set, storage media, processor or processing strategy and may be performed by software, hardware, integrated circuits, firmware, micro-code and the like, operating alone or in combination. Likewise, processing strategies may include multiprocessing, multitasking, parallel processing and the like.

As illustrated, the computing system 1600 may or may not further include a touch-sensitive display unit 1610, for outputting determined information as well as receiving a user's touch-gesture based inputs, such as drag and drop, single tap, multiple-taps, etc. The display 1610 may act as an interface for the user to see the functioning of the processor 1602, or specifically as an interface with the software stored in the memory 1604 or in the drive unit 1606.

Additionally, the computing system 1600 may include an input device 1612 configured to allow a user to interact with any of the components of system 1600. The computing system 1600 may also include a disk or optical drive unit 1606. The disk drive unit 1606 may include a computer-readable medium 1618 in which one or more sets of instructions 1614, e.g., software, can be embedded. Further, the instructions 1614 may embody one or more of the methods or logic as described. In a particular example, the instructions 1614 may reside completely, or at least partially, within the memory 1604 or within the processor 1602 during execution by the computing system 1600.

The present disclosure contemplates a computer-readable medium that includes instructions 1614 or receives and executes instructions 1614 responsive to a propagated signal so that a device connected to a network 1626 can communicate voice, video, audio, images or any other data over the network 1626. Further, the instructions 1614 may be transmitted or received over the network 1616 via a communication port or interface 1620 or using a bus 1608. The communication port or interface 1620 may be a part of the processor 1602 or may be a separate component. The communication port 1620 may be created in software or may be a physical connection in hardware. The communication port 1620 may be configured to connect with a network 1616, external media, the display 1610, or any other components in computing system 1600, or combinations thereof. The connection with the network 1616 may be established wirelessly as discussed later. Likewise, the additional connections with other components of the system 1600 may be established wirelessly. The network 1616 may alternatively be directly connected to the bus 1608.

The network 1616 may include wireless networks, Ethernet AVB networks, or combinations thereof. The wireless network may be a cellular telephone network, an 802.11, 802.16, 802.20, 802.1Q or WiMax network. Further, the network 1616 may be a public network, such as the Internet, a private network, such as an intranet, or combinations thereof, and may utilize a variety of networking protocols now available or later developed including, but not limited to TCP/IP based networking protocols. The system is not limited to operation with any particular standards and protocols. For example, standards for Internet and other packet switched network transmission (e.g., TCP/IP, UDP/IP, HTML, HTTP) may be used.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated. In this description, a "computing entity" may be any computing system as previously defined in the present disclosure, or any module or combination of modulates running on a computing system.

At least by virtue of aforesaid, the present subject matter describes an approximate shape of the substrate with precision. In addition, from the standpoint of the speed of calculation and processing of the shape data for stress calculation, the present subject matter renders a time-efficient solution. In addition, the present subject matter renders it possible to approximate closed equations for the case of the substrate which is slightly misplaced on the point of support. The foregoing description discusses approximate solutions with respect to the misalignment of the substrate 101 from the support elements in a form of a translation and rotation of the substrate or a combination of both.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

To the extent that method or apparatus embodiments herein are described as having certain numbers of elements, it should be understood that fewer than all of the elements may be necessary to define a complete claim. In addition, sequences of operations or functions described in various embodiments do not require or imply a requirement for such sequences in practicing any of the appended claims. Operations or functions may be performed in any sequence to effectuate the goals of the disclosed embodiments.

While specific language has been used to describe the disclosure, any limitations arising on account of the same are not intended. As would be apparent to a person in the art, various working modifications may be made to the method in order to implement the inventive concept as taught herein.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein.

Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the forthcoming claims.

What is claimed:

1. A method for non-contact measurement of stress in a thin-film deposited on a substrate, the method comprising:
   positioning a substrate on a plurality of support elements, the substrate having a thin-film deposited thereupon;
   defining a first-polynomial representing a surface of the substrate that is in contact with the support elements, the first polynomial being based one or more distances between the support elements in contact with the surface of the substrate;
   determining a second-polynomial based on an optimization determination of a potential-energy acting upon the substrate, the optimization determination including performing one or more calculations that reduce a stored potential energy in the substrate and that reduce the gravitational potential energy of the substrate;
   creating a finite-order polynomial formed by calculating a product of the first and second polynomials to represent a shape of the surface of the substrate as a model of the surface;
   determining stress in the substrate based on fitting the model of the surface with a measured topographical data of the surface; and
   adjusting one or more of a position and an orientation of the substrate on the plurality of support elements based on the determined stress in the substrate.

2. The method as claimed in claim 1, wherein determining the stress comprises:
   modifying the model of the surface while fitting the model of the surface with the topographical data; and
   calculating an intrinsic stress in the film based on the modified model of the surface.

3. The method as claimed in claim 1, wherein the first polynomial is a lower-order polynomial than the second polynomial.

4. The method as claimed in claim 1, wherein the second polynomial is a $12^{th}$ order polynomial.

5. The method as claimed in claim 1, further comprising:
   determining a parameter pertaining to mis-alignment of the substrate with respect to the support elements, the parameter defining a linear-displacement of the substrate in a direction perpendicular to an axis of the support elements coplanar with the support elements; and
   determining the second polynomial based on the determined parameter.

6. The method as claimed in claim 1, further comprising:
   determining a parameter pertaining to mis-alignment of the substrate with respect to the support elements, the parameter defining an angular-displacement with respect to an axis of rotation normal to the plane span by the support elements; and
   determining the second polynomial based on the determined parameter.

7. The method as claimed in claim 1, wherein the determination of the second polynomial comprises determining one or more coefficients defined as a part of the second polynomial.

8. A method for non-contact measurement of stress in a thin-film deposited on a substrate, the method comprising:
   representing a shape of surface of the substrate by a model of the surface based on creating a finite-order polynomial, the finite order polynomial defined by a product of:
      a lower-order polynomial representing a surface of the substrate that is in contact with a plurality of support elements, wherein the support elements support the substrate above ground, the lower-order polynomial being based one or more distances between the support elements in contact with the surface of the substrate;
      a higher-order polynomial determined from an optimization of a potential-energy acting upon the substrate, the optimization determination including performing one or more calculations that reduce a stored potential energy in the substrate and that reduce the gravitational potential energy of the substrate; and
   fitting the model of the surface with a measured topographical data by transforming the higher order polynomial into a fitted polynomial;
   determining stress in the substrate based on an updated finite order polynomial defined by the product of the lower order polynomial and the fitted polynomial; and
   adjusting one or more of a position and an orientation of the substrate on the plurality of support elements based on the determined stress in the substrate.

9. The method as claimed in claim 8, prior to transforming, the method further comprises:
   determining the finite order polynomial based on a parameter pertaining to mis-alignment of the substrate with respect to the support elements, the parameter defining a linear-displacement of the substrate in a direction perpendicular to an axis of the support elements, and coplanar with the supporting elements.

10. The method as claimed in claim 8, prior to transforming, the method further comprises:
    determining the finite order polynomial based on a parameter pertaining to mis-alignment of the substrate with respect to the support elements, the parameter defining an angular-displacement of the substrate with respect to an axis normal to the plane span by the support elements.

11. An apparatus for non-contact based measurement of stress in a thin-film deposited on a substrate, the apparatus comprising:
    a plurality of support elements supporting the substrate above ground;
    a topography measurement unit configured to measure topography data of a surface of the substrate, the topography measurement unit including an array of light-emitting diodes (LED) and one or more of a set of cameras and a set of detector units; and
    a processor configured to cause performance of operations comprising:
       defining a first-polynomial representing a surface of the substrate that is in contact with the support elements, the first-polynomial being based one or more distances between the support elements in contact with the surface of the substrate;
       determining a second-polynomial based on an optimization determination of a potential-energy acting upon the substrate, the optimization determination including performing one or more calculations that reduce a stored potential energy in the substrate and that reduce the gravitational potential energy of the substrate;

creating a finite-order polynomial formed by calculating a product of the first and second polynomial to represent a shape of the surface of substrate as a model of the surface;

determining stress in the substrate based on fitting the model of the surface with the measured topographical data received from the topography measurement unit; and adjusting one or more of a position and an orientation of the substrate on the plurality of support elements based on the determined stress in the substrate.

12. The apparatus as claimed in claim 11, wherein the plurality of support elements comprise a first support element and a second support element separated by a predefined distance, the first and second support elements being positioned symmetrically with respect to the substrate.

13. The apparatus as claimed in claim 11, wherein the plurality of support elements are defined by at least two parallel rows including a series of linearly placed support elements, each of the two parallel rows being positioned symmetrically with respect to the substrate.

14. The apparatus as claimed in claim 11, wherein the topography measurement unit comprises:

at least one LED panel configured to emit an emitted beam of light towards the substrate; and at least one camera configured to capture a reflected beam of light that includes at least a portion of the emitted beam as reflected from a surface of the substrate.

* * * * *